United States Patent
Yamaguchi

(10) Patent No.: US 11,148,937 B2
(45) Date of Patent: Oct. 19, 2021

(54) METHOD OF MANUFACTURING SEMICONDUCTOR DEVICE AND SEMICONDUCTOR DEVICE

(71) Applicant: Mitsubishi Electric Corporation, Tokyo (JP)

(72) Inventor: Yasuo Yamaguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/594,314

(22) Filed: Oct. 7, 2019

(65) Prior Publication Data
US 2020/0180948 A1 Jun. 11, 2020

(30) Foreign Application Priority Data
Dec. 10, 2018 (JP) .............................. JP2018-230608

(51) Int. Cl.
*B81C 1/00* (2006.01)
*B81B 7/00* (2006.01)

(52) U.S. Cl.
CPC .......... *B81C 1/00301* (2013.01); *B81B 7/007* (2013.01); *B81B 2201/0235* (2013.01); *B81B 2201/0242* (2013.01); *B81B 2203/0136* (2013.01); *B81B 2207/096* (2013.01); *B81C 2201/0132* (2013.01)

(58) Field of Classification Search
CPC .................................................... H01L 33/382
See application file for complete search history.

(56) References Cited

U.S. PATENT DOCUMENTS

| 2006/0179942 | A1* | 8/2006 | Fukaura | G01P 15/0802 |
| | | | | 73/514.16 |
| 2006/0189124 | A1* | 8/2006 | Beer | H01L 25/105 |
| | | | | 438/622 |
| 2008/0113466 | A1* | 5/2008 | Moriya | H05K 3/0035 |
| | | | | 438/57 |
| 2018/0108625 | A1 | 4/2018 | Hosokawa et al. | |

FOREIGN PATENT DOCUMENTS

| CN | 107360729 A | 11/2017 |
| JP | 2003-322662 A | 11/2003 |

OTHER PUBLICATIONS

An Office Action mailed by China National Intellectual Property Administration dated Jul. 15, 2021, which corresponds to Chinese Patent Application No. 16594314.X and is related to U.S. Appl. No. 16/594,314; with English language translation.

* cited by examiner

*Primary Examiner* — William A Harriston
(74) *Attorney, Agent, or Firm* — Studebaker & Brackett PC

(57) ABSTRACT

A method includes attaching an upper substrate to an upper surface of a sensor substrate, forming, on an upper surface of the upper substrate, a mask providing a first opening and a second opening communicating with the first opening, the second opening having a width that decreases with increase in a distance from the first opening, carrying out a sandblast process on the upper substrate exposed to an outside via the first opening and the second opening, allowing the sensor substrate to be exposed to the outside immediately below the first opening, and forming a slope on the upper substrate immediately below the second opening, and forming a first wiring member in contact with the exposed sensor substrate and a second wiring member being in contact with the slope and continuing to the first wiring member.

6 Claims, 7 Drawing Sheets

METHOD OF MANUFACTURING SEMICONDUCTOR DEVICE AND SEMICONDUCTOR DEVICE

BACKGROUND

Field

The present invention relates to a method of manufacturing a semiconductor device and relates to a semiconductor device.

Background Art

A typical method for manufacturing an electronic device, such as the method disclosed in JP 2003-322662 A, may include the steps of preparing a semiconductor substrate and first and second glass substrates; forming a recess in a first surface of the first glass substrate; forming a functional unit on the semiconductor substrate; joining a first surface of the semiconductor substrate and a second surface of the first glass substrate; etching the recess in the first surface of the first glass substrate so that it extends therethrough and all the way to the second surface thereof; and forming a connection hole in the bottom portion thereof, wherein the functional unit of the semiconductor substrate is exposed to the outside via the connection hole; joining a second substrate of the semiconductor substrate and a first substrate of the second glass substrate; and forming a conductive film on the inner wall of the connection hole and forming an electrode connected to the functional unit exposed to the outside at the bottom portion.

An existing semiconductor device is configured by providing a semiconductor substrate that includes a sensor and attaching multiple substrates which may be made of silicon or glass to the semiconductor substrate. In such a semiconductor device, a through hole is formed in the substrate on the semiconductor substrate and a metal wiring member is formed on the substrate exposed to the outside via the through hole. For example, the through hole may be formed by a sandblasting technique. The metal wiring member is connected to an electrode pad provided on the substrate and wire bonding is performed on the metal wiring member, and thus it is made possible to pick up electrical signals from the semiconductor substrate.

When a through hole is formed in a substrate made of glass or the like using a sandblasting technique, the through hole will have a tapered shape in which the bottom that has been processed has a smaller area than that of the surface that has been processed. Such a tapered through hole may impart a steep grade to the sidewall. The risk of disconnection of a wiring member increases if the wiring member is formed on a sidewall with such a steep grade.

SUMMARY

The present invention has been made for addressing the above-identified problem and an object thereof is to provide a method for manufacturing a semiconductor device and a semiconductor device that prevent or reduce the risk of disconnection.

In some examples, a method of manufacturing a semiconductor device includes attaching an upper substrate to an upper surface of a sensor substrate, forming, on an upper surface of the upper substrate, a mask providing a first opening and a second opening communicating with the first opening, the second opening having a width that decreases with increase in a distance from the first opening, carrying out a sandblast process on the upper substrate exposed to an outside via the first opening and the second opening, allowing the sensor substrate to be exposed to the outside immediately below the first opening, and forming a slope on the upper substrate immediately below the second opening, wherein a height of the slope increases with increase in a distance from the first opening, and forming a first wiring member in contact with the exposed sensor substrate and a second wiring member being in contact with the slope and continuing to the first wiring member.

Other and further objects, features and advantages of the invention will appear more fully from the following description.

DETAILED DESCRIPTION

Figure 1:
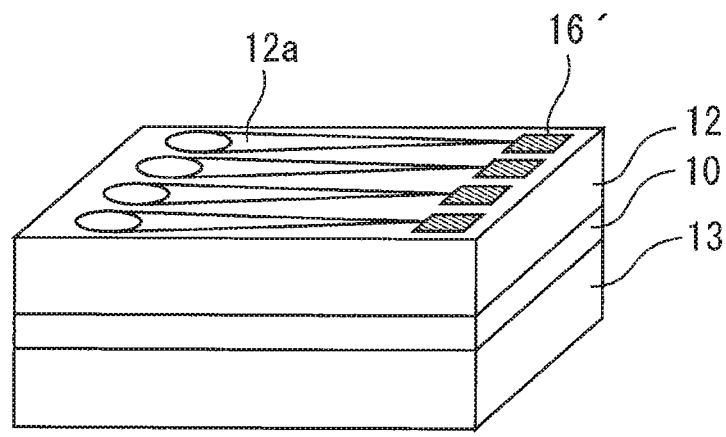
FIG. 1 is a perspective view of the semi-finished semiconductor device according to a first embodiment.
Figure 1:
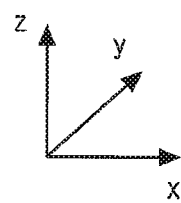

A method of manufacturing a semiconductor device and a semiconductor device according to an embodiment of the present invention will be described hereinbelow with reference to the drawings. The same or corresponding components may be assigned the same reference numerals and redundant explanations will not be repeated. The scope of the present invention is not limited to the specific examples described below.

First Embodiment

FIG. 1 is a perspective view of the semiconductor device, which is being manufactured, according to a first embodiment. The semiconductor device includes a sensor substrate 10 on which an acceleration sensor is formed. An upper substrate 12 is provided on the upper surface of the sensor substrate 10. A lower substrate 13 is provided on the lower surface of the sensor substrate 10. The sensor substrate 10 is protected by the upper substrate 12 and the lower substrate 13. The materials of the upper substrate 12 and the lower substrate 13 may contain glass. For example, the upper substrate 12 and the lower substrate 13 may be made of glass materials. Meanwhile, the sensor substrate 10 may be made of a silicon material. The upper substrate 12 is attached to the upper surface of the sensor substrate 10, the lower substrate 13 is attached to the lower surface of the sensor substrate 10, and thereby a semiconductor device having substrates in three layers is provided.

A through hole 12a is provided in the upper substrate 12. In the example illustrated in FIG. 1, four through holes 12a elongated in the x-direction are formed in the upper substrate 12. Pad sections 16' for forming an electrode pad are provided on the upper surface of the upper substrate 12.

Figure 2:
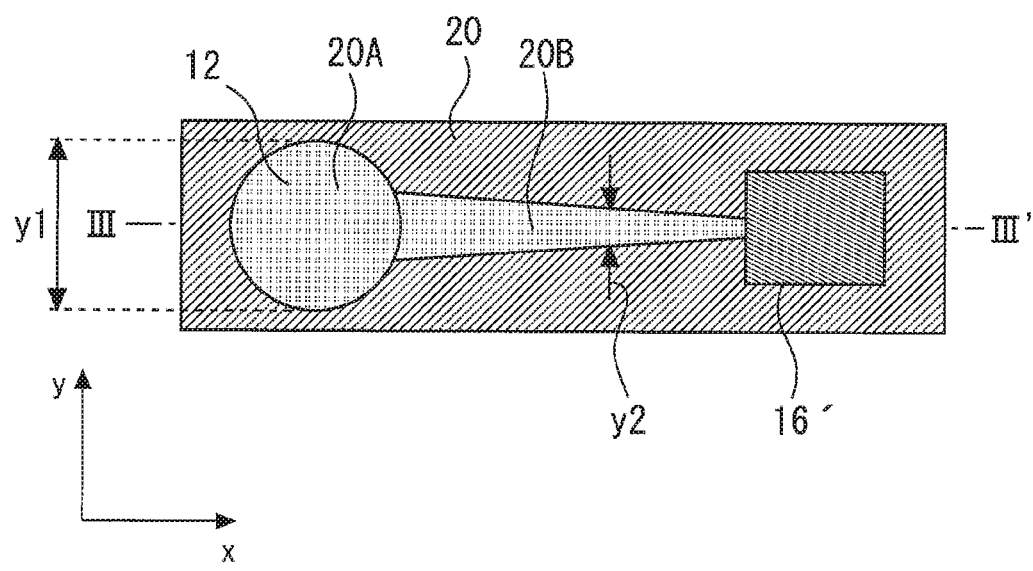
FIG. 2 illustrates a plan view of the mask.

After the substrates have been attached to each other in the above-described manner, a mask is formed on the upper surface of the upper substrate 12. FIG. 2 is a plan view that illustrates an example of the configuration of the mask 20. The mask 20 has a first opening 20A and a second opening 20B so as to allow a part of the upper substrate 12 to be exposed to the outside. The width y1 of the first opening 20A is larger than the width y2 of the second opening 20B. As an example, the first opening 20A has a circular shape and the second opening 20B has a tapered shape. As an example, the second opening 20B communicates with the first opening 20A and the width y2 decreases with increase in the distance from the first opening 20A. The pad section 16' for forming the electrode pad can be covered by the mask 20. The electrode pad may be formed in the pad section 16' at any appropriate step. The mask 20 may be formed on the entire surface of the upper substrate 12 of FIG. 1.

Figure 3:
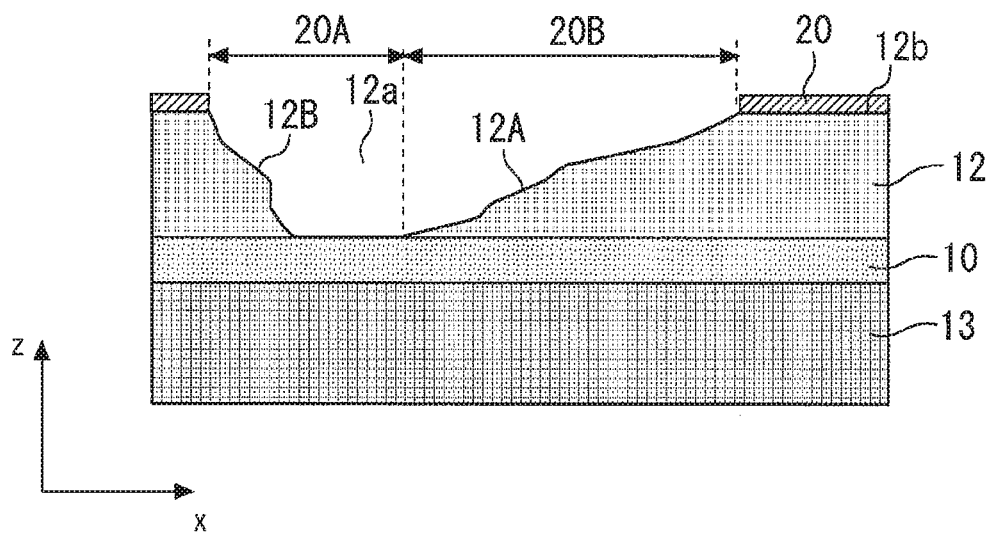
FIG. 3 illustrates a cross-sectional view of the semiconductor device after the sandblast process.

Next, a sandblast process is carried out on the upper substrate 12 exposed to the outside via the first opening 20A and the second opening 20B. FIG. 3 is a cross-sectional view that illustrates an example of the configuration of the semiconductor device that has undergone the sandblast process. FIG. 3 is a cross-sectional view taken along the line III-III' in FIG. 2. The sensor substrate 10 is exposed to the outside immediately below the first opening 20A. A sidewall 12B is formed in the first opening 20A. A slope 12A is formed in the upper substrate 12 immediately below the second opening 20B such that the height of the slope 12A increases with increase in the distance from the first opening 20A. When the upper substrate 12 is made of a material that contains glass, the upper substrate 12 can be readily processed by sandblasting. The grade of the slope 12A is smaller than the grade of the sidewall 12B.

Figure 4:
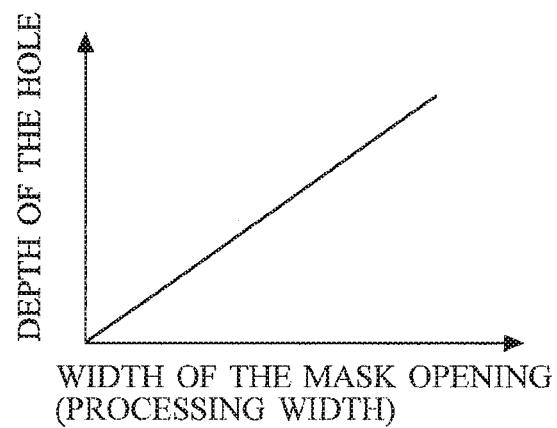
FIG. 4 shows the relationship between the width of the mask opening and the depth of the hole.

FIG. 4 is a diagram that indicates the relationship between the width of the opening of the mask and the depth of the hole created by sandblasting. A hole or recess created by sandblasting has a smaller width at its lower side than at the upper side. In other words, a tapered hole or recess is created. For example, whilst the maximum width of the hole or recess is substantially equal to the width of the opening of the mask, the width of the hole or recess at its lower portion is smaller than the width of the opening of the mask.

If the width of the opening of the mask 20 becomes smaller, then the hole or recess formed in the upper substrate 12 will also become shallower. Accordingly, the slope 12A illustrated in FIG. 3 can be obtained by gradually decreasing the width of the second opening 20B with increase in the distance from the first opening 20A as illustrated in FIG. 2 and carrying out the sandblast process. A slope 12A with a moderate grade can be obtained by reducing the rate of change of the width of the second opening 20B in the x-direction in FIG. 2. In other words, a tapered slope 12A can be formed by gradually decreasing the width of the second opening 20B from the first opening 20A to the pad section 16'. In this manner, a tapered slope 12A with a small grade is formed between the first opening 20A and the pad section 16'. The mask 20 is removed after completion of the sandblast process.

Figure 5:
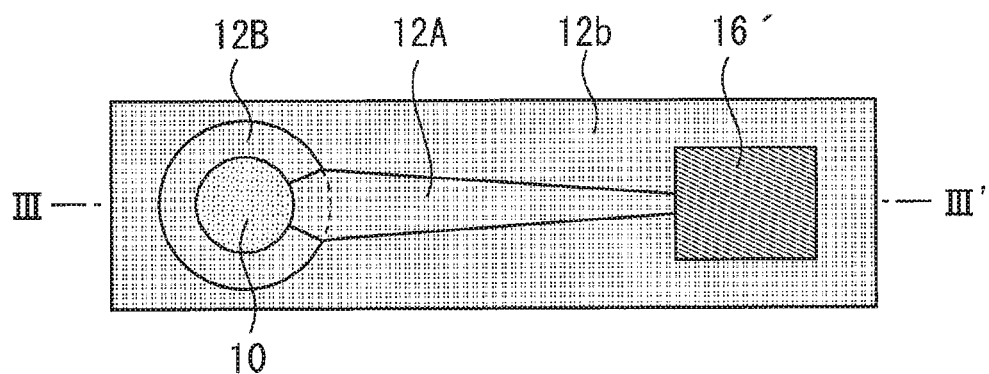
FIG. 5 is a plan view of the semiconductor device after the sandblast process.

FIG. 5 is a plan view of the semiconductor device that has undergone the sandblast process. For example, the sidewall 12B is provided in a C-shape when it is viewed from above in this plan view. The slope 12A continues to the sidewall 12B. The through hole 12a is provided on the upper substrate 12 by the sidewall 12B and the slope 12A.

Figure 6:
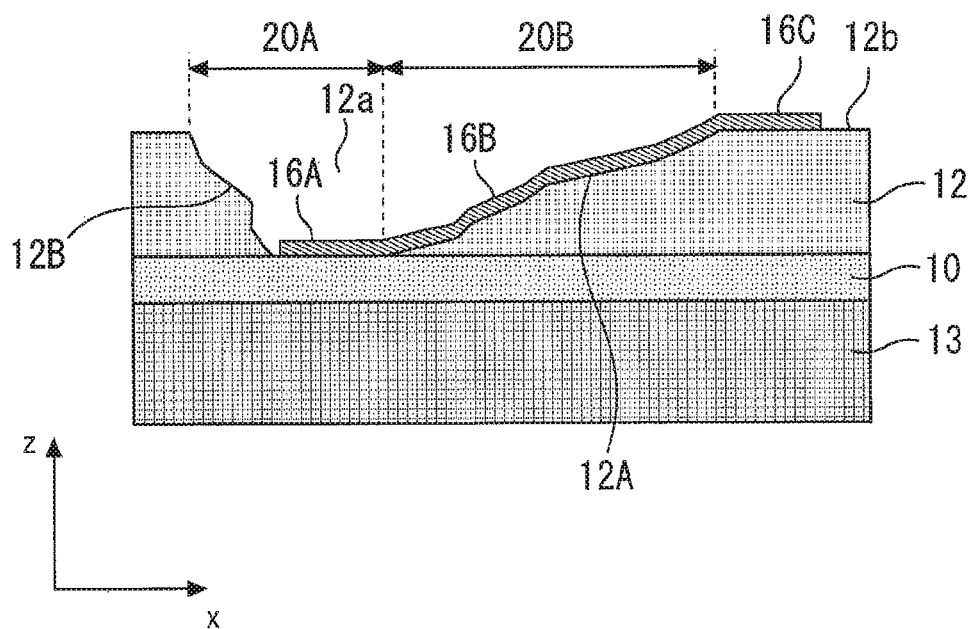
FIG. 6 is a cross-sectional view of the semiconductor device after the creation of the wiring members.

Next, a wiring member is formed. FIG. 6 is a cross-sectional view of the semiconductor device after completion of the creation of the wiring members. As an example, it is conceivable to create a first wiring member 16A in contact with the sensor substrate 10 exposed to the outside via the through hole 12a of the upper substrate 12 and a second wiring member 16B in contact with the slope 12A and continuing to the first wiring member 16A. For example, the electrode pad 16C can be created on the upper surface 12b of the upper substrate 12 concurrently with the creation of the first wiring member 16A and the second wiring member 16B. In the example illustrated in FIG. 6, the second wiring member 16B is in contact with the slope 12A and connects the first wiring member 16A to the electrode pad 16C. The first wiring member 16A, the second wiring member 16B, and the electrode pad 16C may be created by forming a metal film after creation of the mask pattern.

The first wiring member 16A may continue to the electrode of the sensor substrate 10. When the first wiring member 16A is connected to the electrode pad 16C via the second wiring member 16B, an electrical signal of the sensor can be picked up from the electrode pad 16C. For example, a wire may be attached to the electrode pad 16C so as to pick up the electrical signal using the wire. A semiconductor device having these features can be provided as an MEMS (Micro Electro Mechanical System) device that includes multiple bonded wafers and detects a physical quantity such as acceleration and angular velocity.

As described above, the grade of the slope 12A is more moderate than the grade of the sidewall 12B of the upper substrate 12 formed immediately below the first opening 20A by the sandblast process. When the second wiring member 16B is provided on the slope 12A, disconnection of the wiring member can be suppressed. Also, the above-described method of manufacturing a semiconductor device causes neither increase in the process steps nor increase in the processing costs compared with a sandblasting process using a mask having a simple circular opening. For example, simultaneous creation of the sidewall 12B and the slope 12A leads to a shortened process. Also, simultaneous creation of the first wiring member 16A and the second wiring member 16B will also contribute to the shortening of the process.

The modified example that has been described in the context of the first embodiment can also be implemented on the methods of manufacturing a semiconductor substrate and the semiconductor devices according to the following embodiments. It should be noted that, since the methods of manufacturing a semiconductor device and the semiconductor devices according to the following embodiments have much in common with those according to the first embodiment, the explanations of the following embodiments will focus on the features different than those of the first embodiment.

Second Embodiment

Figure 7:
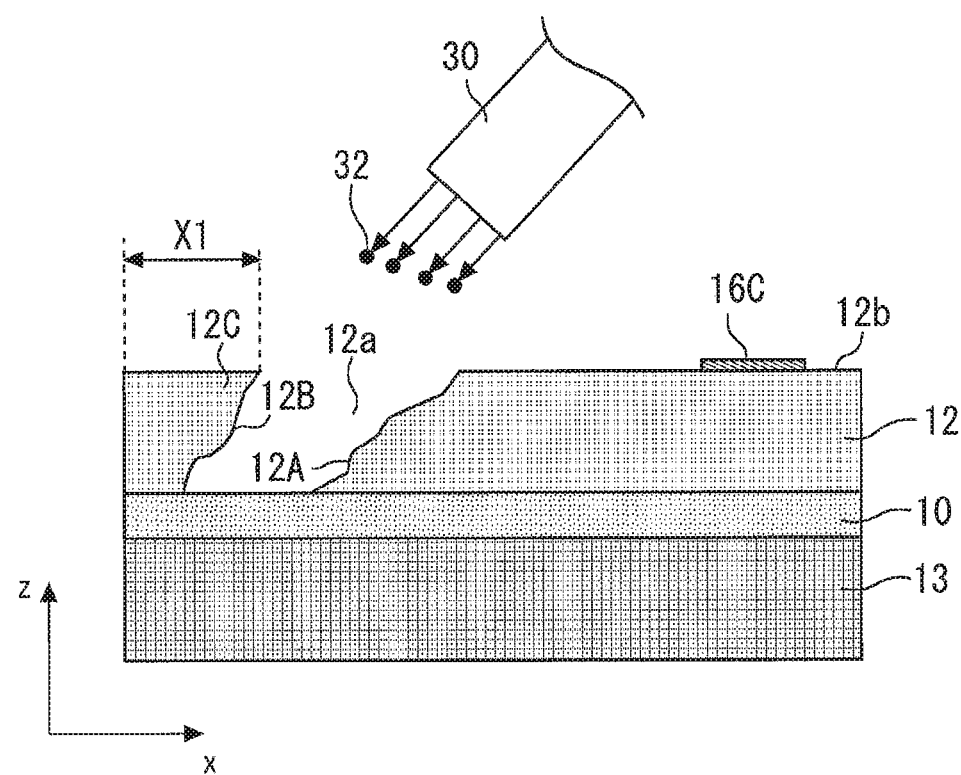
FIG. 7 is a cross-sectional view of the semi-finished semiconductor device according to a second embodiment.

FIG. 7 is a cross-sectional view of the semiconductor device that is being manufactured. The sensor substrate 10 with the acceleration sensor formed thereon, the upper substrate 12, and the lower substrate 13 are attached to each other. At the initial step, substrates are attached to each other in this manner.

Then, sand 32 is delivered from a sandblast nozzle 30 to form a through hole 12a that extends obliquely through the upper substrate 12. The sandblast process may be performed in a state where the sandblast nozzle 30 is tilted with respect to the upper surface of the upper substrate 12. The slope 12A and the sidewall 12B can be formed on the upper substrate 12 by this sandblast process. The slope 12A, which resides in the through hole 12a, is a surface oriented in a direction away from the sensor substrate 10. In other words, the slope 12A can be recognized in the plan view when the substrate is viewed from above. The sidewall 12B, which also resides in the through hole 12a, is a surface oriented toward the sensor substrate 10. In other words, the sidewall 12B is provided as the underside of an eave 12C provided in the upper substrate 12. Accordingly, the sidewall 12B cannot be viewed in the plan view when the substrate is viewed from above. The through hole 12a extending obliquely through the upper substrate 12 thus provides the slope 12A, the cave 12C, and the sidewall 12B as the underside of the eave 12C.

Figure 8:
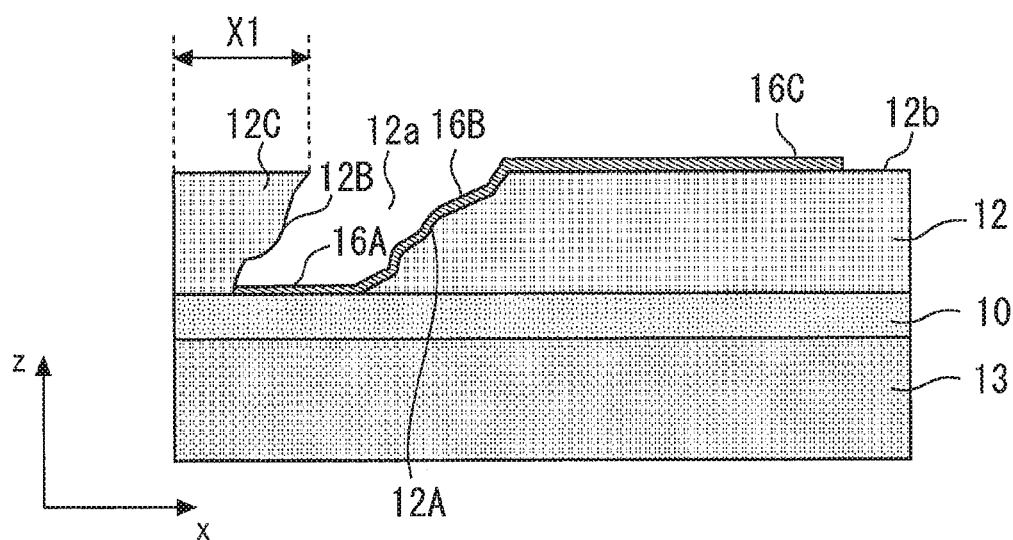
FIG. 8 illustrates a cross-sectional view of the semiconductor device on which the wiring member is formed.

Next, the wiring member is formed. FIG. 8 is a cross-sectional view that illustrates an example of the semiconductor device on which the wiring member is formed. The wiring member may include a first wiring member 16A and a second wiring member 16B. The first wiring member 16A is in contact with the sensor substrate 10 exposed to the outside via the through hole 12a. The second wiring member 16B is brought into contact with the slope 12A so as to interconnect the first wiring member 16A and the electrode pad 16C. The electrode pad 16C is a metal member provided on the upper surface 12b of the upper substrate 12 at an appropriate point in time in an appropriate step. As an example, the second wiring member 16B resides on the slope 12A and the upper surface 12b so as to interconnect the first wiring member 16A and the electrode pad 16C. Whether or not the second wiring member 16B extends to such an extent that it is brought into contact with the upper surface 12b depends upon the length in the x-direction of the slope 12A.

The through hole 12a that has been formed in the upper substrate 12 in the sandblast process can be described as being provided by the tapered slope 12A sloping with a small grade toward the electrode pad 16C and the sidewall 12B formed in a reverse tapered shape in the direction away from the electrode pad.

Figure 9:
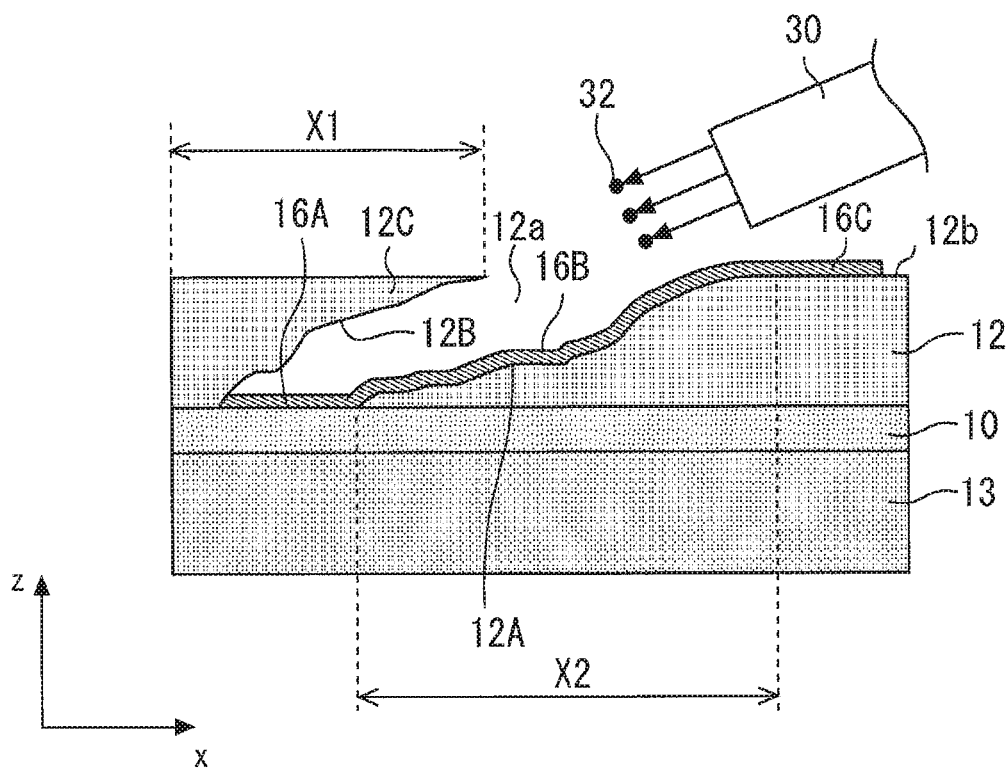
FIG. 9 shows a modified example.

As described above, the second wiring member 16B illustrated in FIG. 8 is brought into contact with the slope 12A and the upper surface 12b of the upper substrate 12 so as to interconnect the first wiring member 16A and the electrode pad 16C. It is also possible to provide a slope with a smaller grade than that of the slope 12A illustrated in FIG. 8. FIG. 9 illustrates an example where the sandblast nozzle 30 is further tilted compared with the above-described example of FIG. 7. FIG. 9 illustrates the second wiring member 16B formed on the slope 12A formed by the sandblast process with a smaller grade. The second wiring member 16B has only to be formed on the slope 12A so as to interconnect the first wiring member 16A and the electrode pad 16C. In this manner, a slope 12A with a smaller grade can be formed by largely tilting the sandblast nozzle 30 to deliver the sand 32 onto the upper substrate 12.

The through hole 12a extending obliquely through the upper substrate 12 provides the eave 12C in the upper substrate 12. The eave 12C increases the area of the portion of the upper substrate 12 where the electrode pad 16C is not formed. For example, when FIG. 6 is compared with FIG. 7, the semiconductor device of FIG. 7 has the larger area of the upper substrate 12 at the end of the semiconductor device by virtue of presence of the eave 12C. Specifically, the distance XI of FIG. 7 increases. In normal cases, arrangement of patterns is prohibited on the regions within the predetermined distance from the ends of the semiconductor chip. The reverse tapered sidewall 12B makes it possible to arrange the through hole 12a closer to the ends of the chip, so that the area of the chip can be reduced. Also, the pattern of the through hole needs to be formed in the upper substrate 12 but the pattern of the portion corresponding to the wiring members does not need to be provided, so that the semiconductor device can be more readily designed. The area at the upper end of the through hole 12a of FIG. 8 is smaller than the area at the upper end of the through hole 12a of FIG. 6.

Third Embodiment

Figure 10:
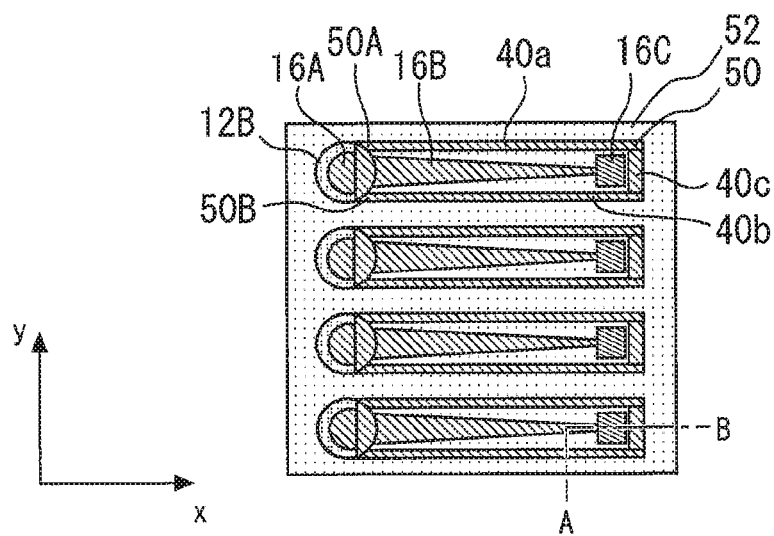
FIG. 10 illustrates a plan view of the semiconductor device according to a third embodiment.

FIG. 10 is a plan view that illustrates an example of the configuration of the semiconductor device according to a third embodiment. The linear groove 50 is formed on the upper substrate. Two grooves extending in the x-direction are connected to each other by a groove extending in the y-direction so as to provide one linear groove 50. As described in the foregoing, since the first wiring member 16A is brought into contact with the sensor substrate exposed to the outside via the through hole of the upper substrate, the through hole of the upper substrate exists immediately above the first wiring member 16A. The first end 50A of the linear groove 50 is connected to the through hole and the second end 50B of the linear groove 50 is connected to the through hole. The electrode pad 16C is provided on the upper surface of the upper substrate 12 at the location enclosed by the linear groove 50.

The second wiring member 16B is provided at the location enclosed by the linear groove 50 so as to interconnect the first wiring member 16A and the electrode pad 16C. The slope below the second wiring member 16B can be provided as any one of the slopes that have been described in the foregoing.

Figure 11:
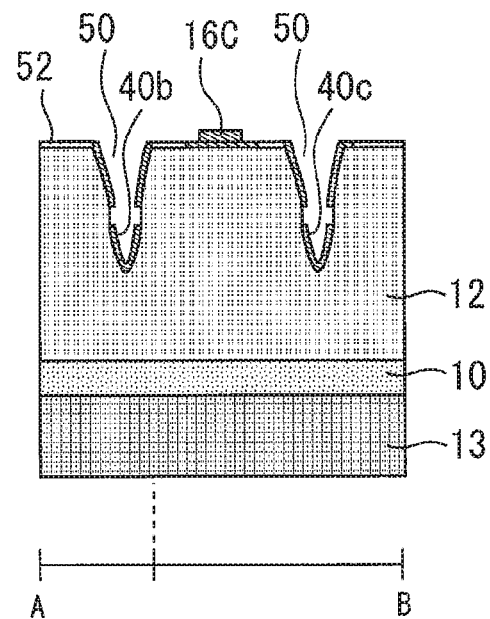
FIG. 11 is a cross-sectional view taken along the line A-B in FIG. 10.

Intra-groove wiring members 40a, 40b, 40c are provided in the linear groove 50. Further, a metal layer 52 is formed on the upper surface of the upper substrate. FIG. 11 is a cross-sectional view taken along the line A-B in FIG. 10. The linear groove 50 is provided by a relatively steeply sloped surface. As a result, the intra-groove wiring members 40b, 40c formed in the linear groove 50 have a cut at the side of the linear groove 50. By virtue of this cut, the portion surrounded by the linear grooves 50 when viewed from above is electrically isolated from the outer portion of the linear groove 50.

The first wiring member 16A, the second wiring member 16B, the electrode pad 16C, the intra-groove wiring members 40a, 40b, 40c, and the metal layer 52 may be provided by forming a metal film on the entire surface of the wafer. Such a metal film is not continuously formed for both of the relatively steeply sloped sidewall 12B and the linear groove 50, so that disconnection occurs at these portions. Accordingly, the metal film in the linear groove 50 functions as one single wiring member.

Figure 12:
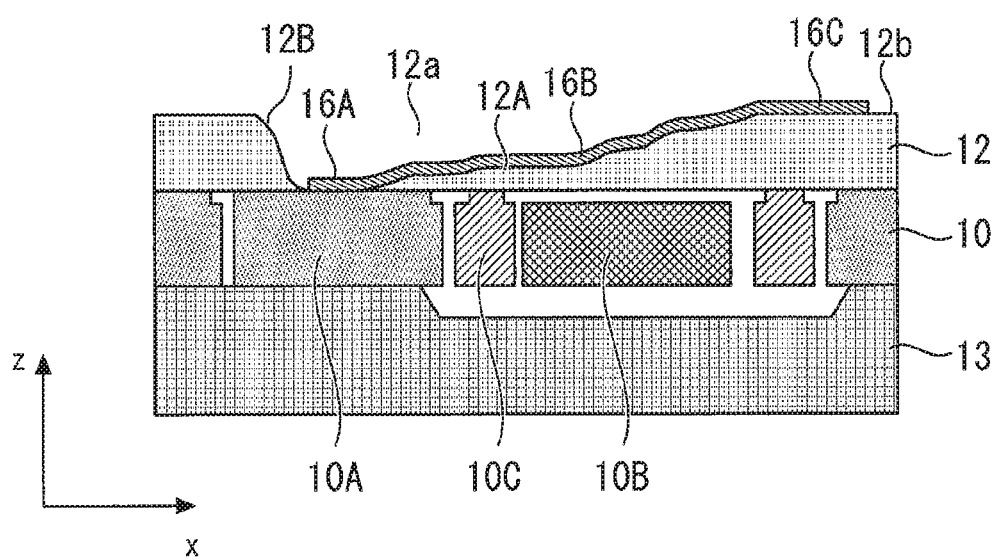
FIG. 12 illustrates a cross-sectional view of the sensor substrate.
Figure 13:
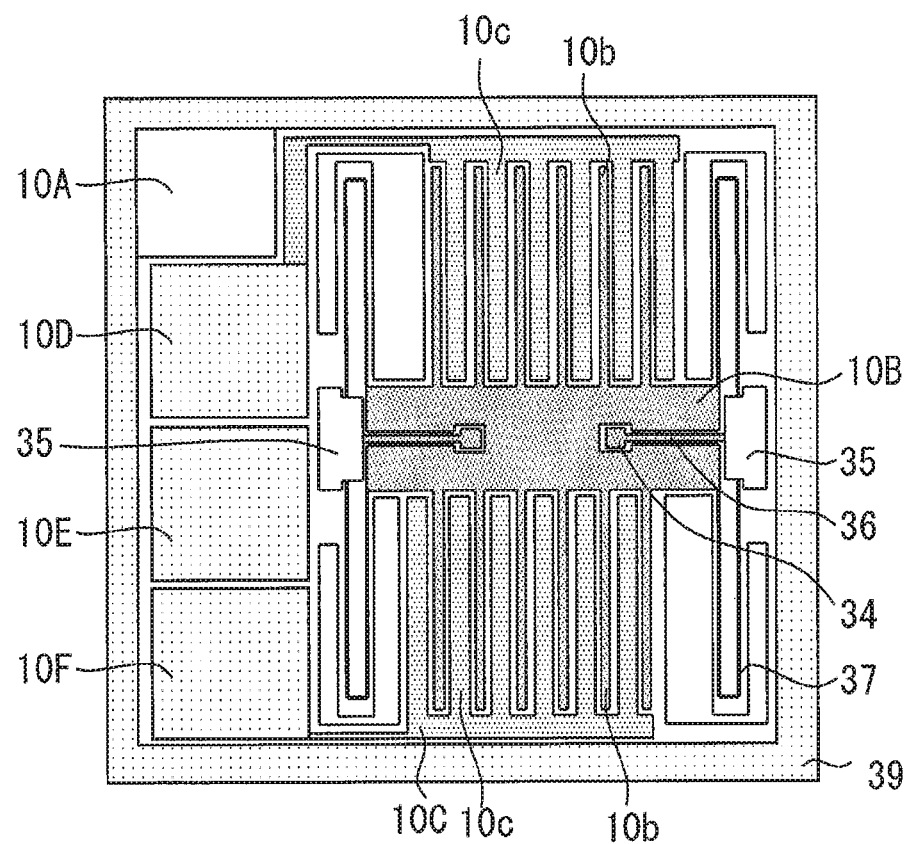
FIG. 13 illustrates a plan view of the sensor substrate.

FIG. 12 is a cross-sectional view that illustrates an example of the configuration of the sensor substrate 10. The sensor substrate 10 may include an electrode 10A, a movable unit 10B, and an opposite unit 10C facing the movable unit 10B. FIG. 13 is a plan view that illustrates an example of the configuration of the sensor substrate 10. The sensor substrate 10 includes the movable unit 10B and the opposite unit 10C which is a non-movable unit. The movable unit 10B includes a movable comb section 10b formed in a shape of a comb, and the opposite unit 10C includes a non-movable comb section 10c formed in a comb shape. The movable comb section 10b and the non-movable comb section 10c are arranged close to each other so as to form a capacitor. The movable unit 10B is connected to the anchor 35 via the beam 37. The movable unit 10B supported by the beam 37 is displaced in accordance with acceleration to impart change in capacitance to the aforementioned capacitor. The post 34 is provided such that it is enclosed by the movable unit 10B and is not in contact with the movable unit 10B. The post 34 is placed in contact with the upper substrate 12 and the lower substrate 13 and thus contributes to improvement of the strength of the semiconductor device. The post 34 is connected to the anchor 35 via a connecting portion 36 which is a conductor. The sensor substrate 10 has a joint frame 39 or is enclosed by the joint frame 39. The upper substrate 12 and the lower substrate 13 can be joined to the joint frame 39 by an anodic bonding technique. The joint frame 39 may be made of silicon material, for example, and the upper substrate 12 and the lower substrate 13 may be made of glass material, for example.

Further, FIG. 13 illustrates four electrodes 10A, 10D, 10E, 10F. The electrode 10A may be configured as a grounding electrode in contact with the joint frame 39. The electrodes 10D, 10E, 10F may be electrically connected to the movable unit 10B or the opposite unit 10C. These four electrodes 10A, 10D, 10E, 10F may be exposed to the outside via four through holes 12a as illustrated in FIG. 1. In addition, the writing members may be formed for the four electrodes 10A, 10D, 10E, 10F in accordance with the above-described methods. In this manner, a capacitive acceleration sensor can be configured by the sensor substrate 10, the upper substrate 12, and the lower substrate 13. An acceleration sensor with any appropriate structure can be provided as the sensor substrate 10. The sensor substrate illustrated in FIG. 12 or 13 can be provided as the sensor substrate 10 according to the embodiments that have been described in the foregoing.

In some examples, the semiconductor devices disclosed herein make it possible to form a wiring member on a moderately sloped surface and provide a method of manufacturing a semiconductor device and a semiconductor device that can prevent or reduce the risk of disconnection.

The invention claimed is:

1. A semiconductor device comprising:
   a sensor substrate;
   an upper substrate provided on an upper surface of the sensor substrate, the upper substrate having a slope and a sidewall such that a through hole is defined by the slope and the sidewall;
   an electrode pad provided on an upper surface of the upper substrate;
   a first wiring member in contact with the sensor substrate exposed to an outside via the through hole;
   a second wiring member being in contact with the slope and connecting the first wiring member to the electrode pad; and
   a lower substrate provided on a lower surface of the sensor substrate, wherein
   a grade of the slope is more gradual than a grade of the sidewall,
   a region of the slope has a tapered shape, in plan view, as it approaches the electrode pad, and
   a width of the through hole, in a direction perpendicular to a direction of the slope connecting the upper substrate to the sensor substrate, increases proportionally with an increasing height of the through hole through the upper substrate.

2. The semiconductor device according to claim 1, wherein
   the sidewall is in a C-shape when viewed from above.

3. A semiconductor device comprising:
   a sensor substrate;
   an upper substrate provided on an upper surface of the sensor substrate, the upper substrate having a slope and a sidewall such that a through hole is defined by the slope and the sidewall;
   an electrode pad provided on an upper surface of the upper substrate;
   a first wiring member in contact with the sensor substrate exposed to an outside via the through hole;
   a second wiring member being in contact with the slope and connecting the first wiring member to the electrode pad; and
   a lower substrate provided on a lower surface of the sensor substrate, wherein
   a grade of the slope is more gradual than a grade of the sidewall, and
   the upper substrate contains glass.

4. A semiconductor device comprising:
   a sensor substrate including an acceleration sensor;
   an upper substrate provided on an upper surface of the sensor substrate, the upper substrate having a slope and a sidewall such that a through hole is defined by the slope and the sidewall;
   an electrode pad provided on an upper surface of the upper substrate;
   a first wiring member in contact with the sensor substrate exposed to an outside via the through hole;
   a second wiring member being in contact with the slope and connecting the first wiring member to the electrode pad; and
   a lower substrate provided on a lower surface of the sensor substrate, wherein
   a grade of the slope is more gradual than a grade of the sidewall, and
   a width of the through hole, in a direction perpendicular to a direction of the slope connecting the upper substrate to the sensor substrate, increases proportionally with an increasing height of the through hole through the upper substrate.

5. A semiconductor device comprising:
   a sensor substrate;
   an upper substrate provided on an upper surface of the sensor substrate, the upper substrate having a slope and a sidewall such that a through hole is defined by the slope and the sidewall;
   an electrode pad provided on an upper surface of the upper substrate;
   a first wiring member in contact with the sensor substrate exposed to an outside via the through hole;
   a second wiring member being in contact with the slope and connecting the first wiring member to the electrode pad; and
   a lower substrate provided on a lower surface of the sensor substrate, wherein
   a grade of the slope is more gradual than a grade of the sidewall, a region of the slope has a tapered shape, in plan view, as it approaches the electrode pad, and the second wiring member has a same shape as the slope.

6. A semiconductor device comprising:

a sensor substrate including an acceleration sensor;

an upper substrate provided on an upper surface of the sensor substrate, the upper substrate having a slope and a sidewall such that a through hole is defined by the slope and the sidewall;

an electrode pad provided on an upper surface of the upper substrate;

a first wiring member in contact with the sensor substrate exposed to an outside via the through hole;

a second wiring member being in contact with the slope and connecting the first wiring member to the electrode pad; and a lower substrate provided on a lower surface of the sensor substrate, wherein a grade of the slope is more gradual than a grade of the sidewall and the second wiring member has a same shape as the slope.

\* \* \* \* \*